United States Patent
Hosny et al.

(10) Patent No.: US 9,853,445 B2
(45) Date of Patent: *Dec. 26, 2017

(54) METHOD AND SYSTEM FOR MONITORING AN ELECTRICAL POWER GRID

(71) Applicant: SiliconPro Inc., Ottawa (CA)

(72) Inventors: Mohamed Samy Hosny, Ottawa (CA); Peter Goharis, Ottawa (CA)

(73) Assignee: MAPLE MICROSYSTEMS INC., Ottawa (CA)

( * ) Notice: Subject to any disclaimer, the term of this patent is extended or adjusted under 35 U.S.C. 154(b) by 357 days.

This patent is subject to a terminal disclaimer.

(21) Appl. No.: 14/701,373

(22) Filed: Apr. 30, 2015

(65) Prior Publication Data

US 2015/0319803 A1    Nov. 5, 2015

Related U.S. Application Data

(60) Provisional application No. 61/988,130, filed on May 2, 2014.

(51) Int. Cl.
| | | |
|---|---|---|
| *G01R 21/00* | (2006.01) | |
| *H02H 7/26* | (2006.01) | |
| *H02H 7/22* | (2006.01) | |
| *H04W 72/04* | (2009.01) | |
| *H04W 74/04* | (2009.01) | |
| *H04W 84/18* | (2009.01) | |

(52) U.S. Cl.
CPC .......... *H02H 7/262* (2013.01); *G01R 21/00* (2013.01); *H02H 7/22* (2013.01); *H04W 72/0446* (2013.01); *H04W 74/04* (2013.01); *H04W 84/18* (2013.01)

(58) Field of Classification Search
CPC ................................ H02H 7/262; G01R 31/08

USPC ........................................................ 702/60
See application file for complete search history.

(56) References Cited

U.S. PATENT DOCUMENTS

| | | |
|---|---|---|
| 6,018,700 A | 1/2000 | Edel |
| 6,778,369 B2 | 8/2004 | Perichon |
| 7,705,747 B2 | 4/2010 | Twitchell, Jr. |
| 8,065,099 B2 | 11/2011 | Gibala et al. |

(Continued)

FOREIGN PATENT DOCUMENTS

WO        2011/156914 A2    12/2011

OTHER PUBLICATIONS

Allegro Microsystems, Inc. A1391, A1392, A1393 and A1395 "Micro Power 3 V Linear Hall Effect Sensor ICs with Tri-State Output and User-Selectable Sleep Mode" Jan. 2010.

(Continued)

*Primary Examiner* — Hoai V Ho
(74) *Attorney, Agent, or Firm* — IP-MEX Inc.; Victoria Donnelly

(57) ABSTRACT

A systems and methods for monitoring an electrical power distribution grid including a plurality of sensor devices forming a sensor wireless network are disclosed. Each sensor device monitors and measures attributes of line current for an associated electrical power distribution line at a selected location. A sensor device detects a fault on the branch of the power grid, determines if the one of the plurality of sensors is at a tail end, sends a fault detected message to an adjacent upstream sensor, or otherwise sends a sleep command to an adjacent downstream sensor from the tail end sensor to disable transmission.

20 Claims, 17 Drawing Sheets

(56) References Cited

U.S. PATENT DOCUMENTS

| | | |
|---|---|---|
| 8,386,198 B2 | 2/2013 | Lancaster |
| 2003/0152059 A1 | 8/2003 | Odman |
| 2007/0136010 A1 | 6/2007 | Gunn et al. |
| 2007/0285857 A1 | 12/2007 | Berkowitz |
| 2008/0198521 A1 | 8/2008 | Weiher |
| 2013/0064178 A1 | 3/2013 | CS et al. |
| 2013/0311634 A1 | 11/2013 | Raymond |
| 2014/0176336 A1 | 6/2014 | Li et al. |
| 2015/0048841 A1* | 2/2015 | He .................. G01R 31/086 324/522 |
| 2015/0226780 A1* | 8/2015 | Sun .................. G01R 31/088 702/59 |

OTHER PUBLICATIONS

Freescale Semiconductor, Inc. by Kimberly Tuck Low Power Modes and Auto-Wake/Sleep Using the MMA8450Q, Jan. 2010.
Lin Gu and John A. Stankovic. "Radio-Triggered Wake-Up for Wireless Sensor Networks". Real-Time Systems, vol. 29, Issue 2, p. 157-182, Mar. 2005.
Darold Wobschall. "Smart Sensors for the Smart Grid", Sensor Tech Forum, Jan. 2011.
Raja Jurdak et al. IEEE Transactions on Mobile Computing. "Radio Sleep Mode Optimization in Wireless Sensor Networks", vol. 9, Issue No. 7, pp. 955-968, Jul. 2010.

* cited by examiner

METHOD AND SYSTEM FOR MONITORING AN ELECTRICAL POWER GRID

REFERENCE TO RELATED APPLICATION(S)

This application claims an invention which was disclosed in Provisional Application No. 61/988,130, filed 2 May 2014, and entitled "A SCALABLE SENSOR NETWORK WITH DISTRIBUTED CONTROL FOR MONITORING ELECTRIC GRID". The benefit under 35 USC §119(e) of the United States provisional application is hereby claimed, and the entire contents of the aforementioned provisional application are hereby incorporated herein by reference.

FIELD OF THE INVENTION

The present invention relates to the field of monitoring an electric power grid using wireless sensor network and, more specifically, optimizing the bandwidth in communication channel during a fault.

BACKGROUND OF THE INVENTION

Electrical power distribution systems often include overhead electrical power distribution lines mounted up on poles by a wide variety of mounting structure. Other distribution systems include underground distribution lines, in which protected cables run under the ground surface.

Generators in electric utilities generate current at medium voltage to transmission transformers, which raise the voltage to very high levels. All over the length of the transmission lines, power substations with respective distribution transformers transform the voltage back into medium voltages supplied to the industrial areas and residential quarters in the cities.

The electric distribution grid in most countries is characterized by aging infrastructure and outdated technology at a time when digital society demands an increased quantity and more reliable electrical power. Very little automation or monitoring typically exists between the customer meter and an electrical substation, making it difficult to quickly identify the cause and location of an electrical distribution problem, for example: a fault, without manual dispatch of field crews. Additionally, planning and maintenance engineers in the electric utilities typically have limited information about the behaviour of a circuit to drive the best decisions for circuit upgrade/rehabilitation tasks, and determining upgrade or replacement of equipment.

A smart grid is a modern electric power grid infrastructure for improved efficiency, reliability and safety. The smart grid utilizes smooth integration of renewable and alternative energy sources through automated control and modern communication technologies. In the smart grid, reliable information of the power grid becomes an important factor for reliable delivery of power from generation units to end users. The impact of equipment failures, limitations of capacity, and natural accidents and catastrophes, which cause power disturbances and outages, can be largely avoided by rapidly monitoring, diagnostics and protection of conditions of power systems. There is a need for continuous, uninterrupted, real time monitoring of parameters of electric power grid as part of a smart grid system.

As the operation and maintenance of distribution networks becomes more complex, an accurate, real-time data obtained from electric power grid becomes more critical than ever. New automation systems like Distribution Management Systems (DMS) and Outage Management Systems (OMS) rely on accurate representation of loads and individual connections for a range of applications, including fault location and automated switching to speed service restoration. Without accurate monitoring of the grid, crews are unable to quickly restore power to individual customers, businesses and neighborhoods.

A common problem in solutions with centralized control location is that they cannot rapidly react to a fault in a timely fashion. Another problem is that many sensors may attempt to report their information at the same time during an outage, which might create traffic congestion in the network. Clearly, there is a need for methods and systems for monitoring an electrical power grid that mitigate or obviate the above problems.

SUMMARY OF THE INVENTION

It is an object of the present invention to provide a sensor network which is capable of scaling from few sensors to thousands of sensors without significantly degrading system performance.

It is another object of the present invention to provide a sensor network with distributed control such that it can rapidly react to a fault or a power outage in a timely fashion.

It is another object of the present invention to provide methods for locating the fault or power outage in the electric power grid.

It is another object of the present invention to provide methods for the sensor network to report the information during an outage without creating traffic congestion.

Embodiments of the invention provide methods and systems including a wireless sensor network including a plurality of sensors that monitors electrical attributes in an electrical power distribution grid and reacts to faults by controlling a device or devices in the grid such as switches, circuit breakers or reclosures. Each sensors is affixed to an associated electrical power distribution line in the electrical power distribution grid.

Some embodiments of the invention provide a system for monitoring electrical power distribution lines including a plurality of sensors adapted for wireless communications. Each sensor monitors attributes in the electrical power lines such as current harmonics, voltage, phase and temperature, at a select locations of the power grid. The system further includes a collector device adapted to collect data from sensors in the network. The collector device may include a sensor device and/or a gateway device for communication outside of the network.

Other embodiments may further provide a sensor network, each such sensor capable of measuring at least one of current fundamental frequency and harmonics to produce measurement data; collecting said data within said sensor device; transmitting data between said sensor device and at least one adjacent sensor device, said sensor device and the adjacent sensor device self-forming into a communications network having a cluster tree network topology; transmitting data to at least one network manager for aggregation; and analyzing said measurement data.

In other embodiments, each sensor may include control capabilities to control devices in the electrical grid such as switches, circuit breakers and reclosures for the purpose of managing loads and grid automation.

In some embodiments the sensors in the wireless network communicate using a wireless network compatible with IEEE Standard 802.15.4.

According to an aspect of the invention there is provided an a method for monitoring an in an electrical power grid, including in a branch of the electrical power grid: detecting a fault by one of a plurality of sensors on the branch of the power grid, determining if the one of the plurality of sensors is upstream from the fault; provided the one of the plurality of sensors is at a tail end from the fault, sending a fault detected message to an adjacent upstream sensor; and otherwise, sending a sleep command to an adjacent downstream sensor from the one of the plurality of sensors for suppressing data transmission of the adjacent downstream sensor.

In some embodiments the sending the fault detected message to an adjacent upstream sensor further includes that provided the one of the plurality of sensors is a fault head end sensor, relaying data from a fault tail end sensor to a collector device, and sending a fault head end sensor data upstream to the collector device otherwise, relaying data from the adjacent downstream sensor to the collector device, waiting for data from a fault head end device, and relaying fault head end device data to the collector device.

In some embodiments the sending the fault detected message to an adjacent upstream sensor further includes that provided the one of the plurality of sensors is a control sensor having a switch, opening the switch; and otherwise, waiting for data from the adjacent downstream sensor.

In some embodiments the sending the fault detected message to an adjacent upstream sensor further includes that provided the one of the plurality of sensors is not a head end control sensor from the fault, closing a switch, putting the one of the plurality of sensors in a sleep mode.

In some embodiments the sending the fault detected message to the adjacent upstream sensor includes sending the fault detected message to the adjacent upstream sensor on a wireless network comprising a plurality of contention free time slots wherein a number of the contention free time slots is equal to or greater than a quantity of sensors in the plurality of sensors.

In some embodiments subsets of the contention free time slots are allocated into frames.

In some embodiments the sending the sleep command to the adjacent downstream sensor from the one of the plurality of sensors includes sending the sleep command to the adjacent downstream sensor from the one of the plurality of sensors on a wireless network comprising a plurality of contention free time slots wherein a number of the contention free time slots is equal to or greater than a quantity of sensors in the plurality of sensors.

In some embodiments subsets of the contention free time slots are allocated into frames.

In some embodiments the method further includes initializing each of the plurality of sensors including: loading each of the plurality of sensors with a map of adjacent sensors; and loading each of the plurality of sensors with information for designating an assigned timeslot for the respective sensor transmitting and receiving data.

In some embodiments the method further includes adding another sensor to the plurality of sensors including: loading the another sensor with a map of adjacent sensors; and loading the another sensor with information for designating an assigned timeslot for the another sensor for transmitting and receiving data.

According to another aspect of the invention there is provided a system for monitoring a fault in an electrical power grid, include a plurality of sensors on the electrical power grid, each sensor including a processor and a memory having computer readable instructions stored thereon, causing the processor to: detect a fault by one of a plurality of sensors on a branch of the power grid, determine if the one of the plurality of sensors is upstream from the fault; provided the one of the plurality of sensors is at a tail end from the fault, send a fault detected message to an adjacent upstream sensor; and otherwise, send a sleep command to an adjacent downstream sensor from the one of the plurality of sensors for suppressing data transmission of the adjacent downstream sensor.

In some embodiments the computer readable instructions causing the processor to send the fault detected message to an adjacent upstream sensor include computer readable instructions that cause the processor to: provided the one of the plurality of sensors is a head end device, relay data from a fault tail end device to a collector device, send a fault head end device data upstream to the collector device, and put the one of the plurality of sensors in a sleep mode; and otherwise, relay data from the adjacent downstream sensor to the collector device, wait for data from a fault head end device, and relay fault head end device data to the collector device.

In some embodiments the computer readable instructions causing the processor to send the fault detected message to an adjacent upstream sensor include computer readable instructions causing the processor to: provided the one of the plurality of sensors is a control device having a switch, open the switch; and otherwise, wait for data from the adjacent downstream sensor.

In some embodiments the computer readable instructions causing the processor to send the fault detected message to an adjacent upstream sensor include computer readable instructions causing the processor to: that provided the one of the plurality of sensors is not a head end control sensor from the fault, closing a switch, putting the one of the plurality of sensors in a sleep mode.

In some embodiments the computer readable instructions causing the processor to send the fault detected message to the adjacent upstream sensor include instructions to cause the processor send the fault detected message to the adjacent upstream sensor on a wireless network comprising a plurality of contention free time slots wherein a number of the contention free time slots is equal to or greater than a quantity of sensors in the plurality of sensors.

In some embodiments subsets of the contention free time slots are allocated into frames.

In some embodiments the computer readable instructions causing the processor to send the sleep command to the adjacent downstream sensor from the one of the plurality of sensors includes computer readable instructions causing the processor to send the sleep command to the adjacent downstream sensor from the one of the plurality of sensors on a wireless network comprising a plurality of contention free time slots wherein a number of the contention free time slots is equal to or greater than a quantity of sensors in the plurality of sensors.

In some embodiments subsets of the contention free time slots are allocated into frames.

In some embodiments the computer readable instructions further include instructions causing the processor to initialize each of the plurality of sensors including: load each of the plurality of sensors with a map of adjacent sensors; and load each of the plurality of sensors with information for designating an assigned timeslot for the respective sensor transmitting and receiving data.

In some embodiments the computer readable instructions further comprise instructions causing the processor to add another sensor to the plurality of sensors including: load the another sensor with a map of adjacent sensors; and load the another sensor with information for designating an assigned timeslot for the another sensor for transmitting and receiving data.

Thus, an improved method and system for monitoring an electrical grid and reporting fault conditions have been provided.

BRIEF DESCRIPTION OF THE DRAWINGS

Embodiments of the invention will now be described, by way of example, with reference to the accompanying drawings, in which.

Figure 1:
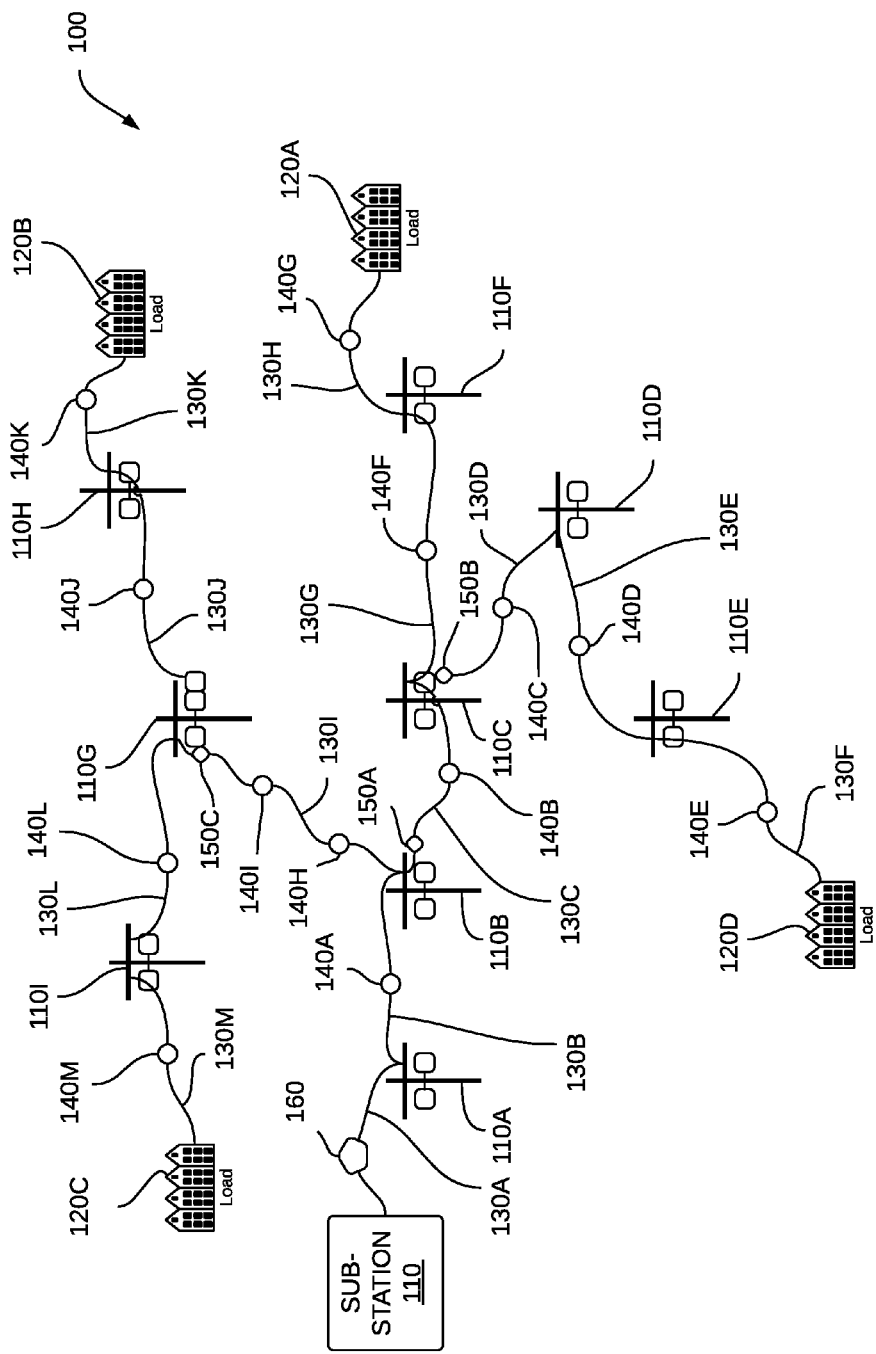
FIG. 1 is a diagram illustrating an electric power distribution grid in accordance with an embodiment of the invention.

The accompanying drawings are included to provide a further understanding of the present invention and are incorporated in and constitute a part of this specification. The drawings illustrate some embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION OF EMBODIMENTS OF THE INVENTION

Embodiments of the invention provide a sensor network, methods and systems for monitoring and controlling an electric power grid, including a sensor network architecture and computational algorithms for detecting and reporting a fault in an electric power grid.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In the description of embodiments of invention, "harmonics" are defined as "integral multiples of the fundamental frequency". AC (Alternating Current) power is delivered throughout an electric power grid at a fundamental frequency of 60 Hz (Hertz or cycles per second) or 50 Hz. As such, the $3^{rd}$ and $5^{th}$ harmonic frequency are 180 Hz and 300 Hz, respectively for 60 Hz fundamental frequency or 150 Hz, and 250 Hz for 50 Hz fundamental frequency, and so on. In general, a conventional electric power grid in commercial facilities has three phase wires and a neutral wire. When loads on all three phases are balanced (the same fundamental current is flowing in each phase) the fundamental currents in the neutral wire cancel each other, and the neutral wire carries no current.

The present patent application relates to a method for measuring electrical attributes in an electric power grid and identifying and locating faults in the electric power grid. In one aspect, a plurality of sensors are each distributed along one of the three phase wires, which each sensor uses a non-contact electromagnetic coupling to measure current and harmonics of the current in the wire. Each sensor along the wire is capable of taking measurements over predetermined time intervals and performs frequency domain analysis and other signal processing algorithms. Embodiments of the present invention describe a method for scaling the network to thousands of sensor devices. In another embodiments of the present invention a last gasp method is provided, which allows the information about a fault in the grid to be communicated to the collector device without causing traffic congestion.

A sensor device comprises a sensor; a transceiver; a processor configured to run digital signal processing algorithms; storage memory; an energy harvesting device; and a virtualization layer software store in the memory, which comprises an application programming interface encapsulating application layer features of the sensor device and which is configured to provide to the application, via at least one service access point, a service to communicate with another sensor device by means of the transceiver, a service to control the sensor, and a service to discover a sensor device network, have the sensor device leave a sensor device network and/or have the sensor device join a sensor device network.

Referring now to FIG. 1, an overhead distribution power grid 100 in accordance with an embodiment of the invention. The grid 100 includes one or more substations 110 that supply electrical power to loads 120A, 120B, 120C, 120D. Branches 130A, 130B, 130C, 130D, 130E, 130F, 130G, 130H, 130I, 130J, 130K, 130L, 130M supply power to loads 120A, 120B, 120C and 120D. Each branch typically includes three conductors (only one shown shown) carrying high voltage power of alternating current with each line being 120 degrees out of phase with the other lines, plus a neutral wire (not shown), as is known in the art.

The power grid 100 further includes a plurality of monitor devices 140A, 140B, 140C, 140D, 140E, 140F, 140G, 140H, 140I, 140J, 140L, 140M for measuring electrical attributes in corresponding branches 130A-130M. The attributes measured include at least one of current, voltage, harmonics and phase attributes of corresponding branches 130A-130M. The monitor devices are further described herein below with reference to FIG. 3A.

The power grid 100 still further includes a plurality of control devices 150A, 150B, 150C for performing measurements as described above in regard to the monitor devices 140A-140M plus control functions. The control devices 150A-150C include software stored in a memory for performing decision intelligence to control devices such as switches in the grid 100. The control devices are further described herein below with reference to FIG. 3B.

The monitor devices 140A-140M may alternatively be referred to herein as monitor sensors. The control devices 150A-150C may alternatively be referred to herein as control sensors. The monitor devices 140A-140M and control devices 150A-150C are referred to collectively herein as sensor devices.

The power grid yet still further includes a collector device 160 for collecting data, such as the electrical attributes, measured from the sensor devices and for updating a database for storage and further processing through, for example, a communication link. The collector device 160 may be attached on the electric line, or may be located in an indoors environment. The collector device is further described herein below with reference to FIG. 4.

Figure 2:
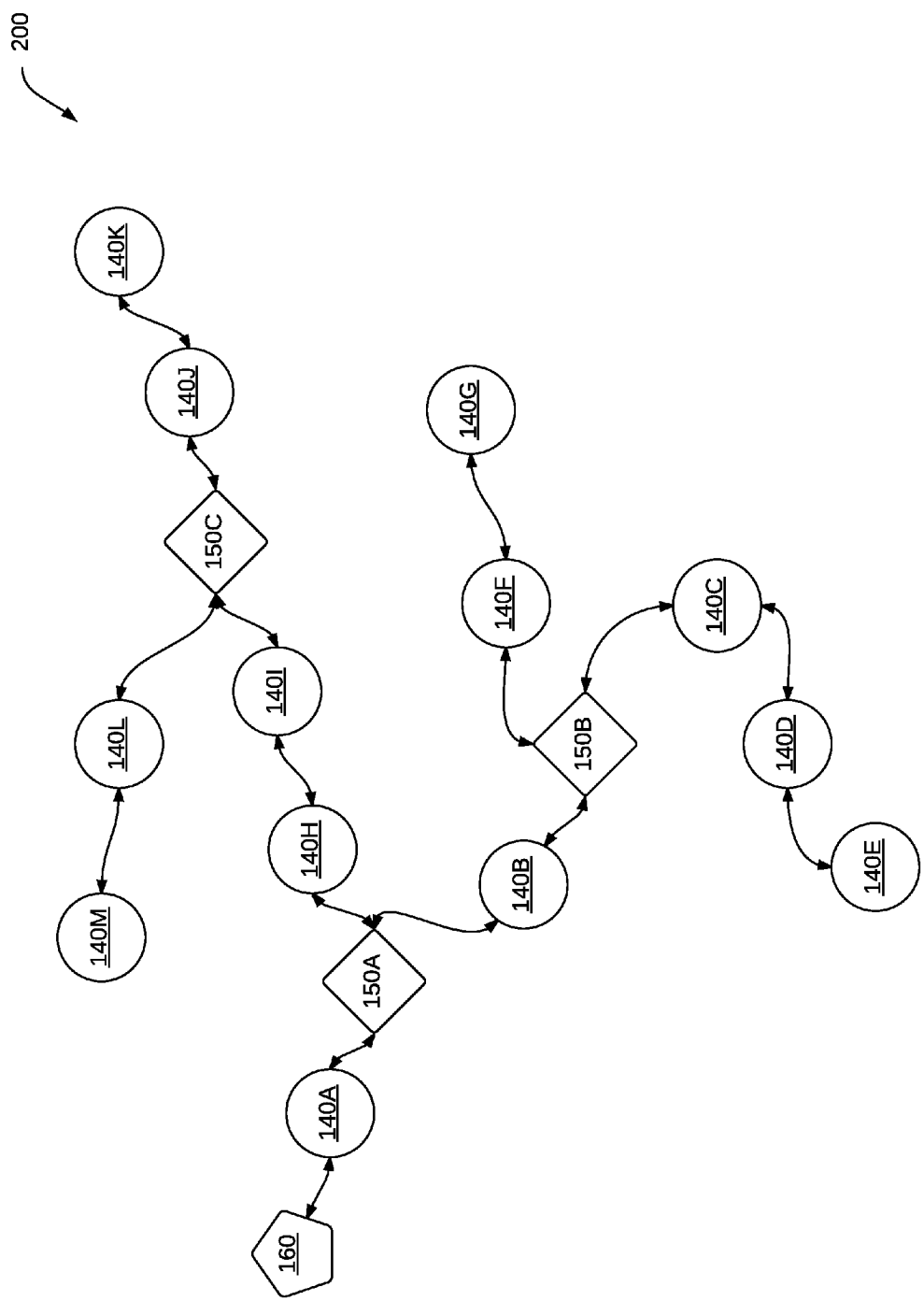
FIG. 2 is a diagram illustrating a configuration of a cluster tree network of collector, control and monitor devices of the electric power distribution grid shown in FIG. 1.

Referring to FIG. 2, the monitor devices 140A-140M, control devices 150A-150C and collector device 160 form a sensor network 200. A type of topology of the sensor network is preferably a cluster tree topology as shown in FIG. 2, but other topologies, mesh and star (not shown) for example, may also be within the scope of the invention. 150A-150C Each sensor device is associated with its closest neighbor sensor device and communicates with this closest neighbor sensor device, such that data transmission is routed towards the collector device 160. Each sensor device is capable of establishing a radio transmission path to the collector device 160 either directly (single hop or through other sensor devices (multi-hop). This type of peer-to-peer device communication can be accomplished by low power wireless communication, in the case of overhead distribution lines, or via communication through the power line itself in the case of underground distribution.

The sensor devices 140A-140M,150A-150C are preferably clamped around a wire 130A-130M for determining electrical power quality in an electrical power grid. The sensor network 200 monitors power grid 100. The sensor devices 140A-140M,150A-150C measure parameters in the distribution grid, and the collector device 160 collects information from the sensor devices 140A-140M,150A-150C in the sensor network 200 for further processing.

Figure 3A:
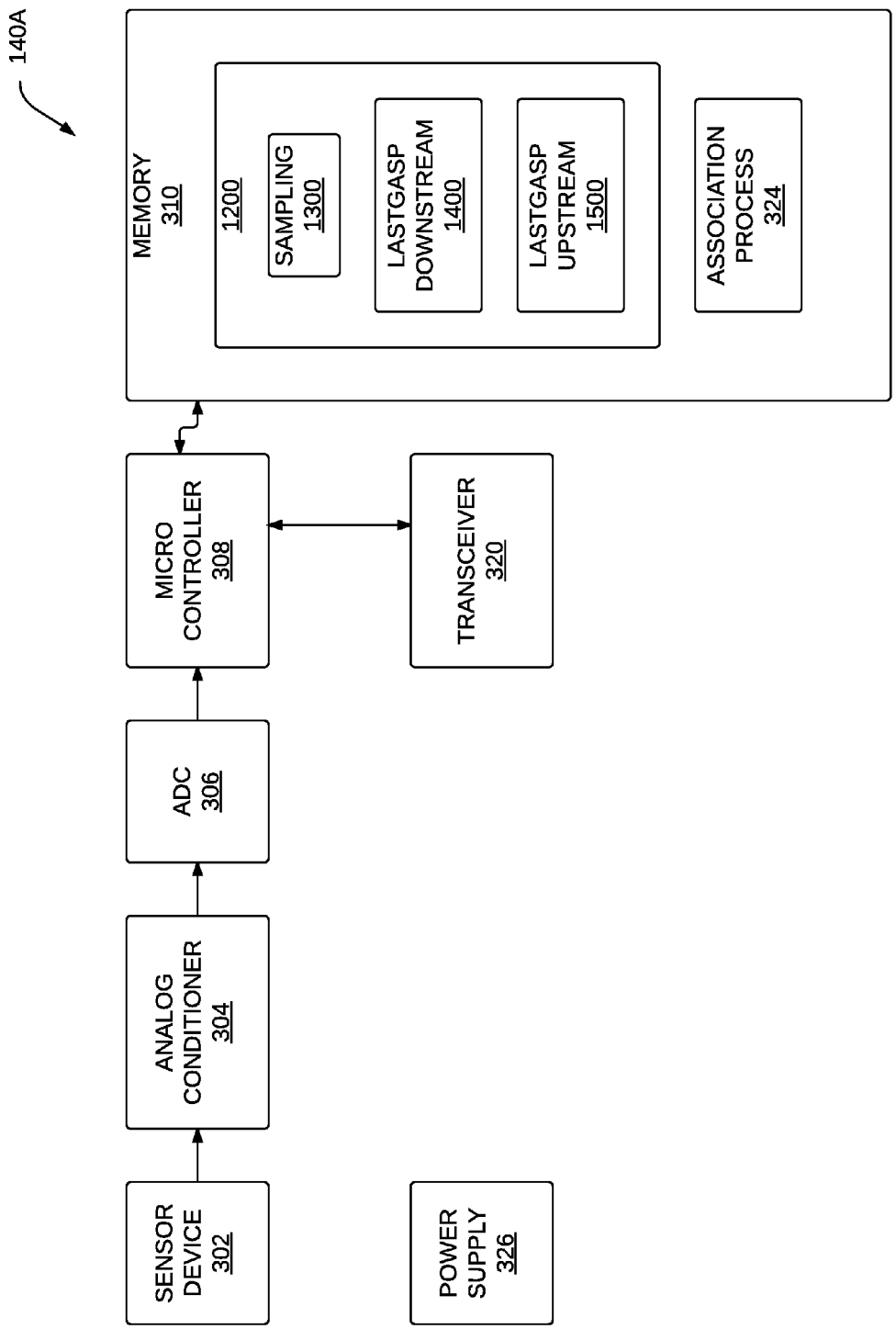
FIG. 3A is a block of one of the monitor devices shown in FIG. 1.

Referring now to FIG. 3A, there is shown a block diagram of one the monitor devices 140A shown in FIG. 1. All of the monitor devices 140A-140M are identical. The monitor device 140A includes, for example, a non-contact voltage sensing or current sensing device 302 such as Rogowski, shunt, Hall Effect for making measurements of the electrical attributes such voltage or current flowing through the line 130B. The sensing device 302 generates voltage signals that correspond to the voltage level or current following the power line 130B. An analog conditioning circuitry 304 performs conditioning, scaling, processing, etc. needed to provide signals compatible with an analog to digital converter (AID) 306. The analog conditioning circuitry 304 may also perform other conditioning, scaling, processing, etc. as needed to provide signals compatible with an internal circuitry of the sensor device.

Microcontroller 308 receives an output from the AID 306 that is a digital representation of the current and voltage signals. The microcontroller 308 may be any form of processing computer device capable of executing instructions to control the overall operation of the sensor device. A microcontroller 308 computes various power parameters such as current, voltage, frequency, harmonics, etc. based on the current and voltage signals received from the sensing device 302 and may store these computations in internal 310 or external memory. The microcontroller 308 may provide at least some of the electrical attributes parameters to communications transceiver circuitry 320 for reporting to the collector device 160 and other sensor devices 140B-140M, 150A-150C in the grid 100. The monitor device 140A also includes a memory 310 for storing computer readable instructions 120 for performing various functions such as sampling 1300 current or voltages from the line 130B, responding to detected faults using downstream 1400 and upstream 1500 methods described herein below with reference to the flowcharts of FIGS. 12,13,14,15A, and 15B.

A power supply 326 provides power to various circuits which includes an energy harvester such as a Current Transformer (CT) or Rogowski coil or any other means of harvesting the energy from the power line 130B. The power supply 324 may also include capacitive circuitry in that stores enough energy to be capable of providing power to the communication circuitry to be able to transmit its data to the collector device 160.

Figure 3B:
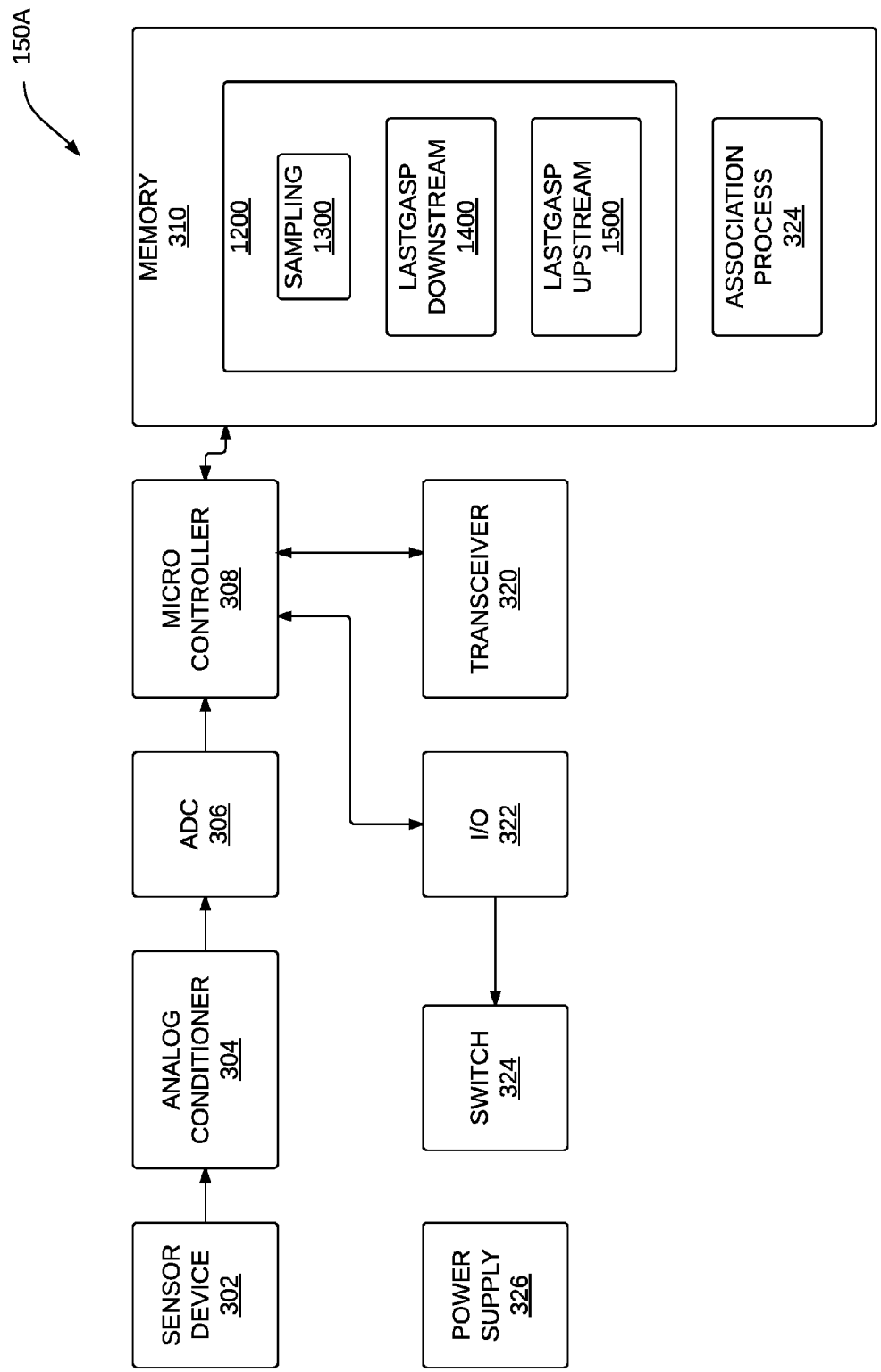
FIG. 3B is a block of one of the control devices shown in FIG. 1.

Referring now to FIG. 3B, there is shown a block diagram of one the control devices 150A shown in FIG. 1. The control device 150A of FIG. 3B is substantially the same as the monitor device of FIG. 3A except that the microcontroller 308 is coupled to an input/output port 322 for controlling a smart grid device, such as a switch 324 or reclosure, based on the information analyzed from the current following in the line 140B and information received from other sensor devices 140A-140M, 150A-150C in the electric grid 100.

The control devices 150A may control the switch 324 based on its own measurements and the information received from neighboring devices. Preferably, one sensor device is placed on each phase on the electric wire within distance "d" between each other, where distance "d" has to be within a range for communication between the sensor devices 140A-140M, 150A-150C.

Geographical location and an ID of the each sensor device 140A-140M, 150A-150C are recorded and stored in the memory for processing. The sensor devices 140A-140M, 150A-150C will then begin to execute a predefined network association process 324 where it will associate with adjacent or a nearby sensor device for communication including. Once a senor device becomes part of the associated network, data measurement and communications begins. This process is repeated for every sensor device 140A-140M, 150A-150C in the grid 100.

Figure 4:
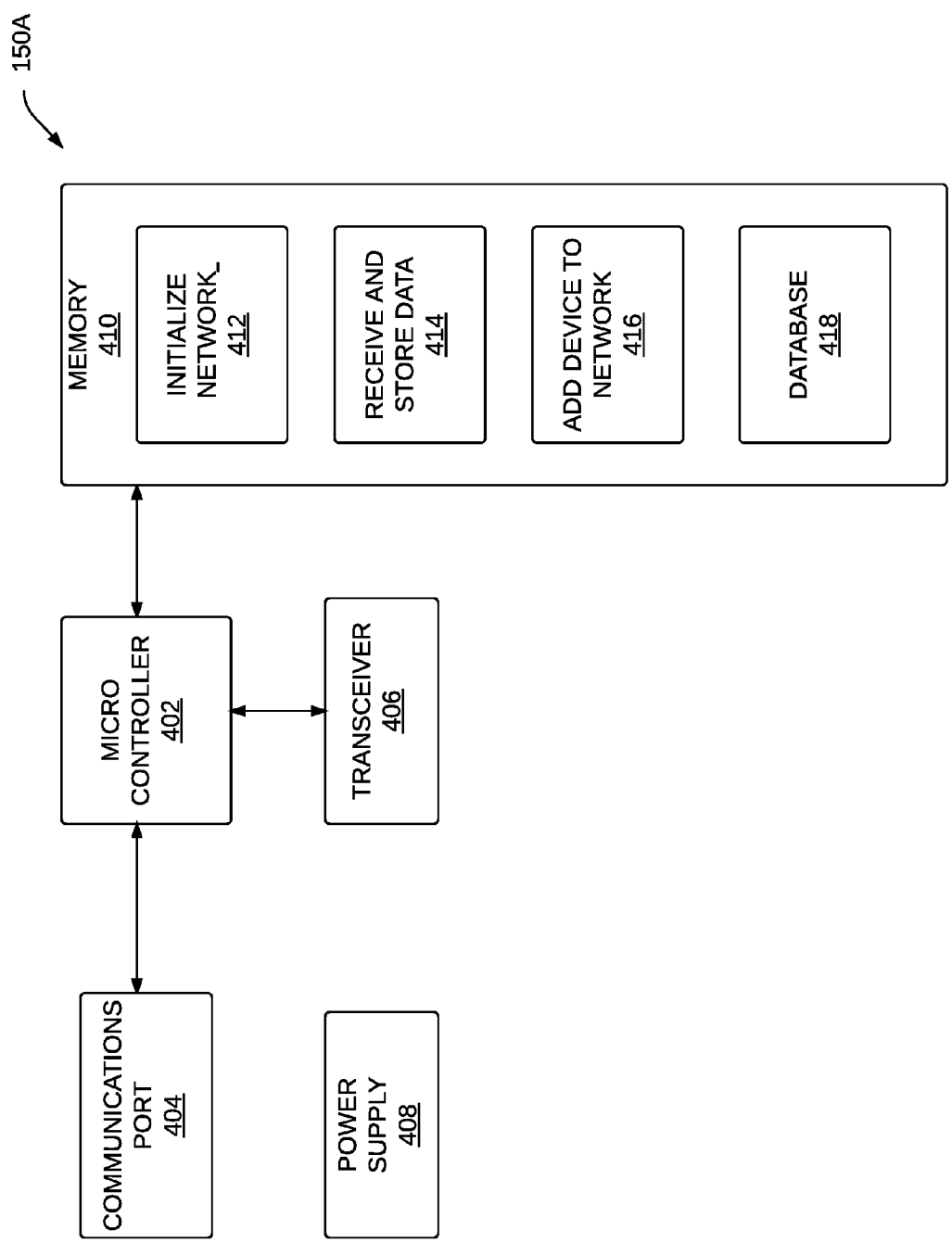
FIG. 4 is a block diagram of the collector device shown in FIG. 1.

FIG. 4 shows a block diagram of the collector device 160. The collector device 160 includes, a microcontroller 402 which may be any form of processing computer device capable of executing instructions to control the overall operation of the collector device 160, including initializing the network 412, receiving and storing data 414 in a database 418, and adding new devices to the network 416. Adding new devices to the network includes receiving an add-sensor command, loading the new devices with a map of adjacent devices; and loading the new devices sensor with information for designating an assigned timeslot for the new sensor for transmitting and receiving data. The microcontroller 402 is coupled to a communication port 404 for communicating to another communication device (not shown) device or a computer server (not shown). A power supply 408 provides power to the various circuits in the collector device 160.

Figure 5:
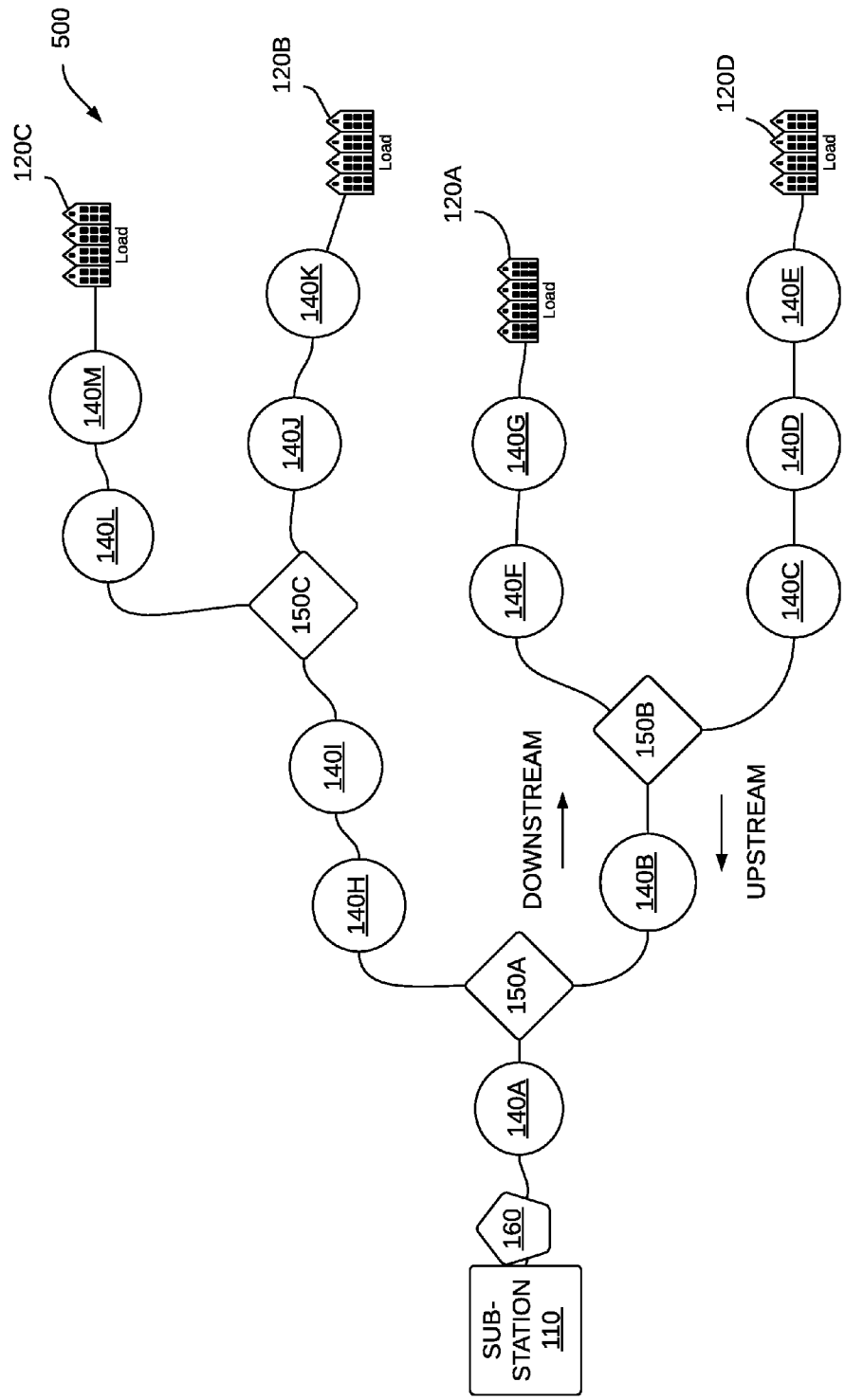
FIG. 5 a block diagram showing electrical connectivity of the electrical distribution grid shown in FIG. 1.

FIG. 5 illustrates an electrical connectivity of the distribution grid 100 showing the substation 110 and loads 120A, 120B, 120C and 120D, monitor devices 140A-140M and control devices 150A-150C transmit messages toward the load in the downstream direction and transmit messages towards the collector device 160 in the upstream direction.

Figure 6:
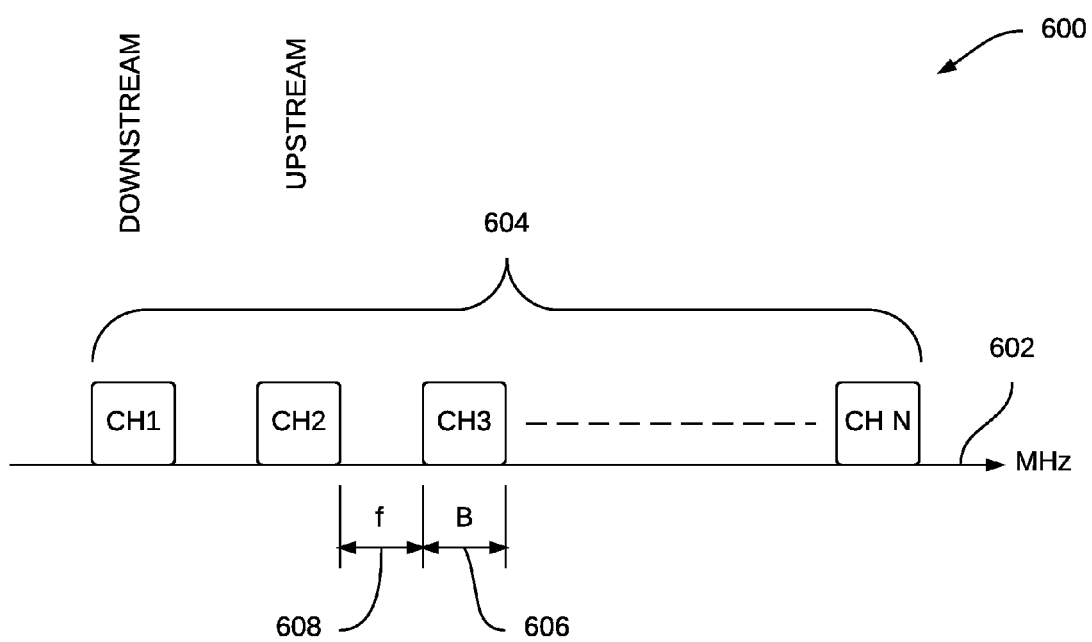
FIG. 6 shows a channel structure for communicating between the collector, control and monitor devices shown in FIG. 1.

FIG. 6 shows a channel structure 600 in a communication system in accordance with embodiments of the invention where a single frequency band 602 is partitioned into a number of channels 604 of bandwidth "B" 606. In order to minimize radio frequency interference between channels 604 and between other systems (not shown), there is a frequency separation "f" 608 between channels 604.

Figure 7:
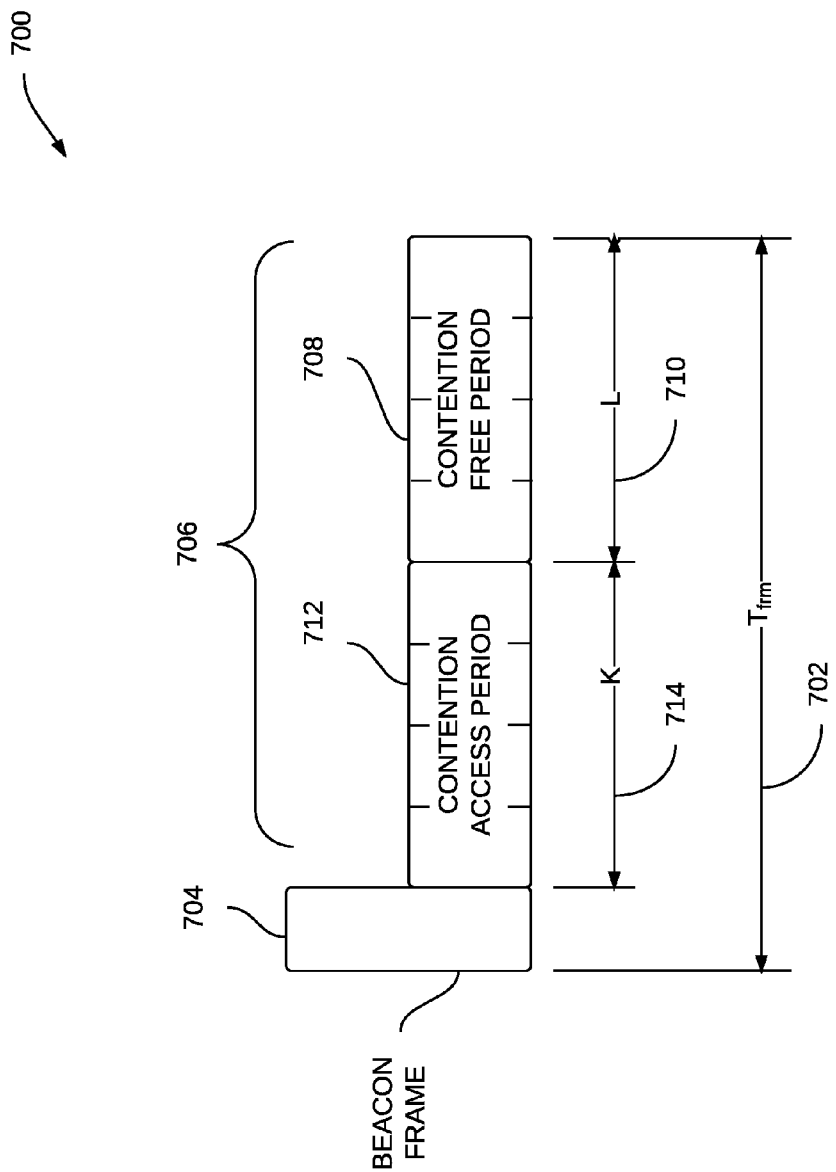
FIG. 7 shows a Time Division Multiplexed frame structure of the channel structure shown in FIG. 6.

FIG. 7 shows a TDM (Time Division Multiplexing) frame structure 700 of duration "$T_{frm}$" 702. A Beacon message 704 is transmitted from the collector device 160 to all of the sensor devices 140A-140M,150A-150C. A frame between the beacons 704 is called a super frame 706. The super frame 706 is further divided into two parts. A first is contention free period (CFP) 708 having "L" Time Slots 710, where each of the sensor devices 140A-140M,150A-150C is guaranteed a certain time slot for transmitting its data. Therefore, the frame 708 will be allocated to "L" sensor devices 140A-140M,150A-150C. A second part of the super frame 712 is a contention access period (CAP) 712 where all of the sensor devices 140A-140M,150A-150C share "K" 714 time slots.

In accordance with embodiments of the present invention, each sensor device 140A-140M,150A-150C is allocated a guaranteed time slot in the contention free period 708 for transmitting its sensor monitoring data to the collector device in the upstream direction. If a total number of sensors in the grid 100 exceed the number time slots in the network "L" 708, more TDM frames are appended in time to construct a multiframe in order to accommodate more sensors in the grid 100 as needed. Such a feature is referred to as scalability. Since the electrical attributes in the electric grid 100 are always slow changing in normal non-fault conditions, it is acceptable to accommodate the additional latency associated with the additional frames to transmit sensor monitoring data in non-fault normal conditions.

Figure 8:
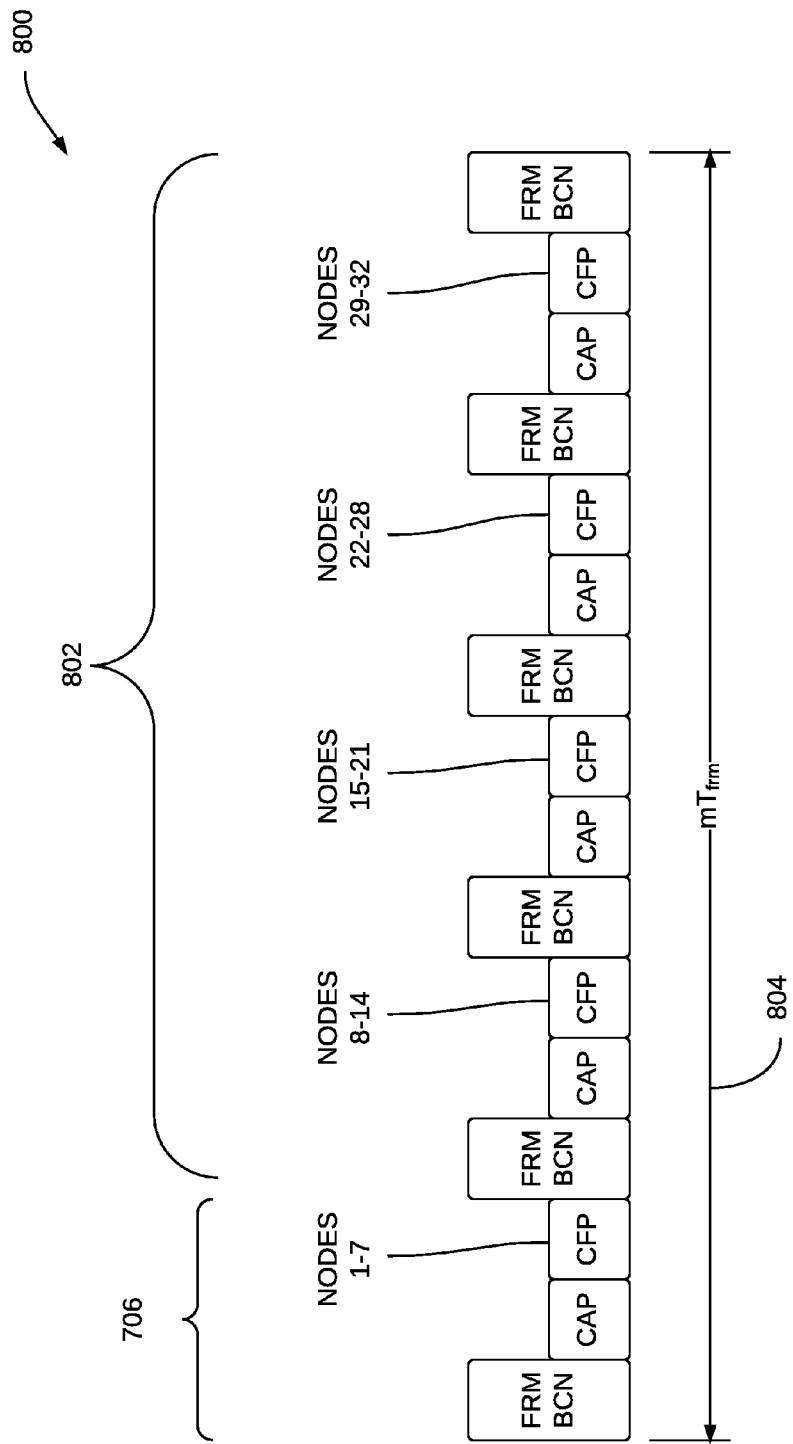
FIG. 8 is a diagram showing another Time Division Multiplexed frame structure of the channel structure shown in FIG. 6.

Referring now to FIG. 8, for illustrating the scalability feature of embodiments of the invention, let's assume a super frame 800 with 7 time slots in the CFP period and 8 time slots in the CAP. Let's also assume that it is required to construct a network of a maximum of 32 sensor devices. In order to accommodate the extra sensors, multiple frames can be dived into subsets and appended to construct a multiframe. In this example 4 additional superframes will be appended with a total duration of "$mT_{frm}$" 804, where m is the number of frames in a multiframe. The collector device 160 will assign one sensor to one time slot. A synchronization mechanism such as Flooding Time Synchronization Protocol (FTSP) can be used for better system performance.

The contention Access Period 712 is used for network management tasks, such as when new sensors joining the network 416 (FIG. 4) and for last-gasp transmissions 1400, 1500, as will be described herein below.

Figure 9:
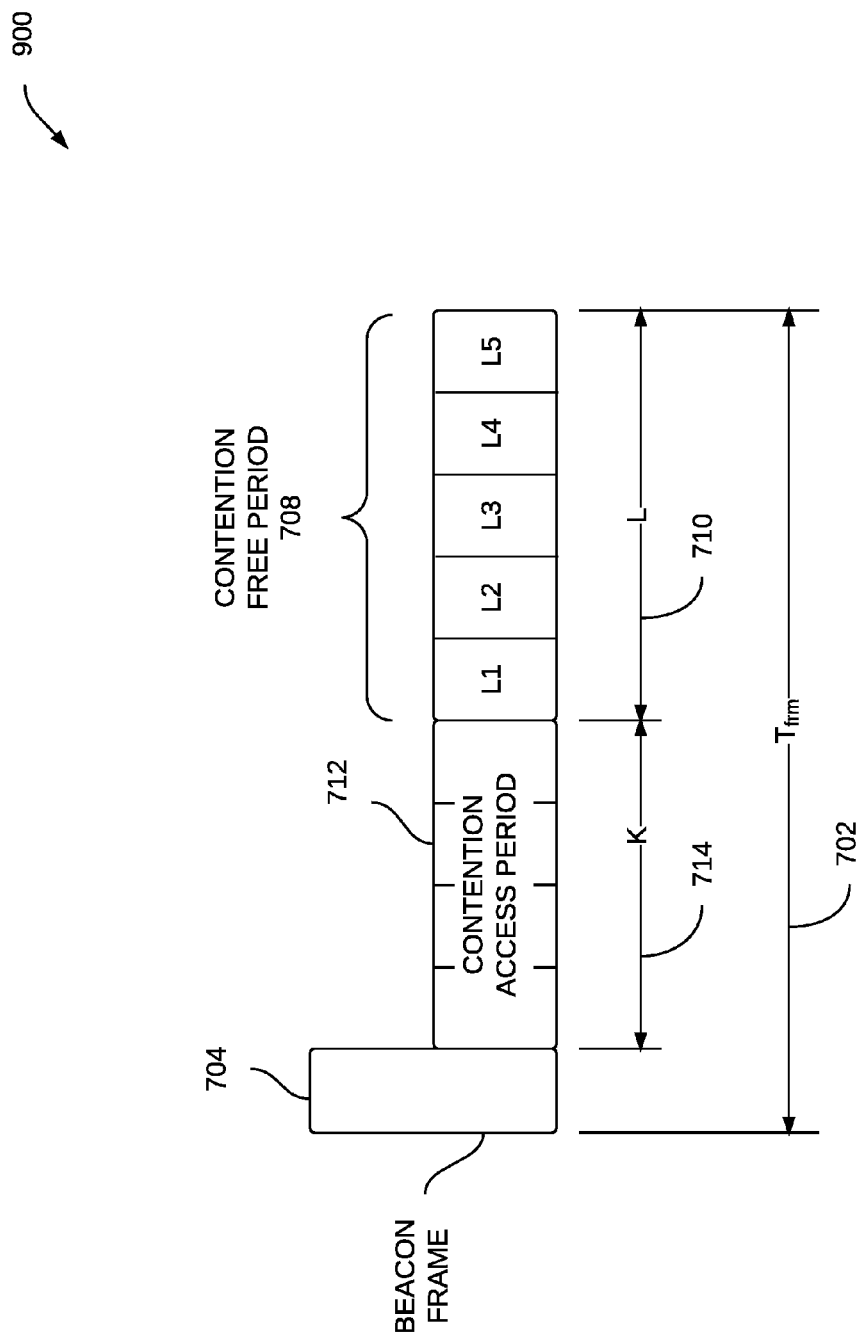
FIG. 9 is a diagram showing another Time Division Multiplexed frame structure of the channel structure shown in FIG. 6.

FIG. 9 shows another example of a frame 900 corresponding to the grind 100. In this embodiment there are 5 contention free time slots 910 and total of 13 monitor devices 140A-140M and 3 control devices 150A-150C that the collector device 160 has to communicate with. In this case 4 multiframes are required to accommodate the total 16 sensors in the CFP.

Figure 10:
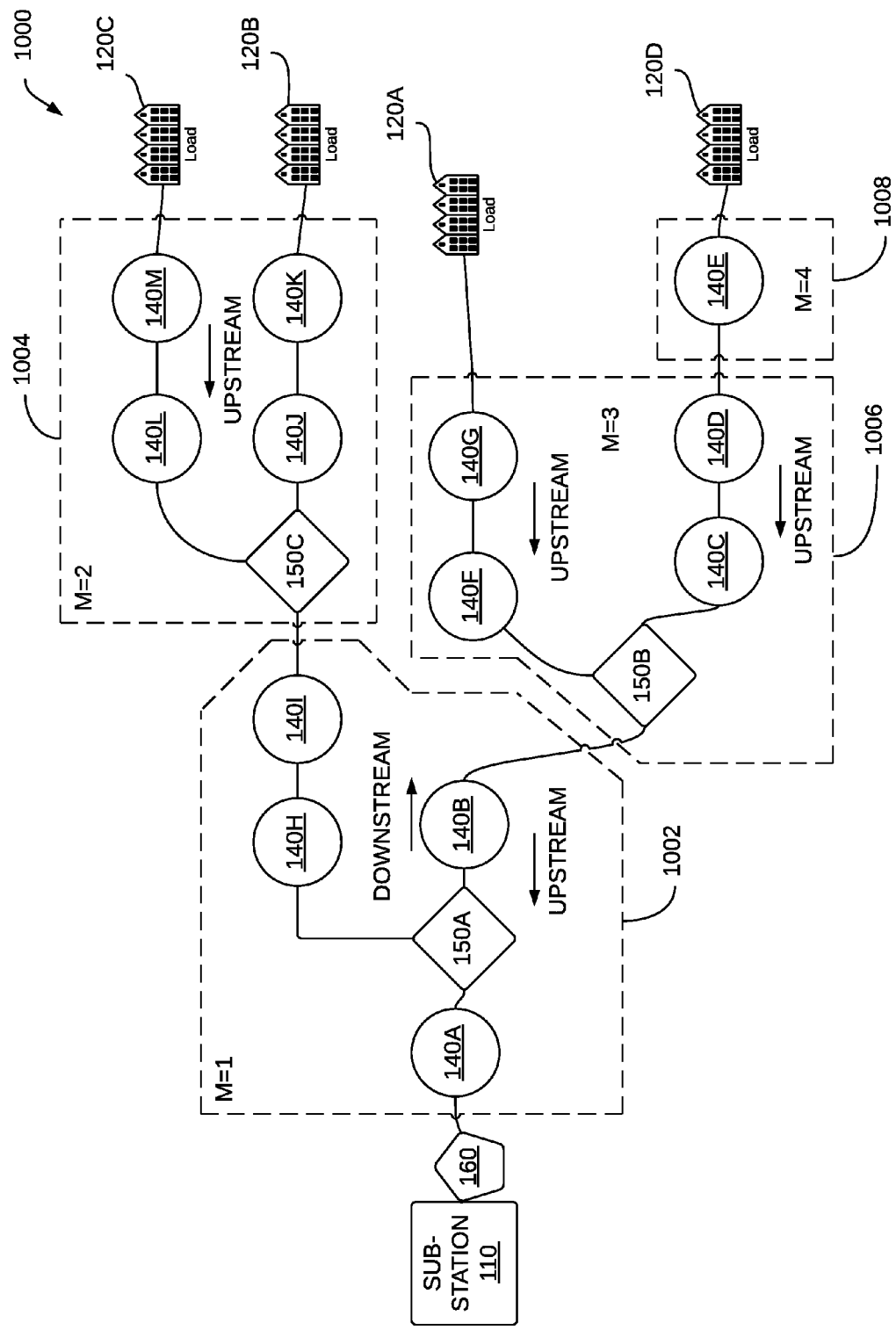
FIG. 10 illustrates communication between the collector, control and monitor devices shown in FIG. 1.

Referring to FIG. 10, the network 200 is divided into 3 groups 1002, 1004, 1006 of 5 sensors each, and the remaining sensor will have group 1008 of its own. Each group in the network will be assigned a frame with a respective beacon M1, M2,M3 and M4. Monitor devices 140A-140M and control devices 150A-150C first join the network 200 using the contention access period 712. Once communication is established, the collector device 160 then initializes each monitor devices 140A-140M and control devices 150A-150C with its respective guaranteed time slot within the multiframe for transmitting the measured sensor monitoring data. In normal operating condition (when there is no fault) all of the sensor devices 140A-140M,150A-150C will report their information in the upstream direction in their respective time slot period "$T_r$".

Embodiments of the invention further provide methods for transmitting the electrical attributes of the fault current and location of the power failure with minimal energy and traffic.

Figure 11:
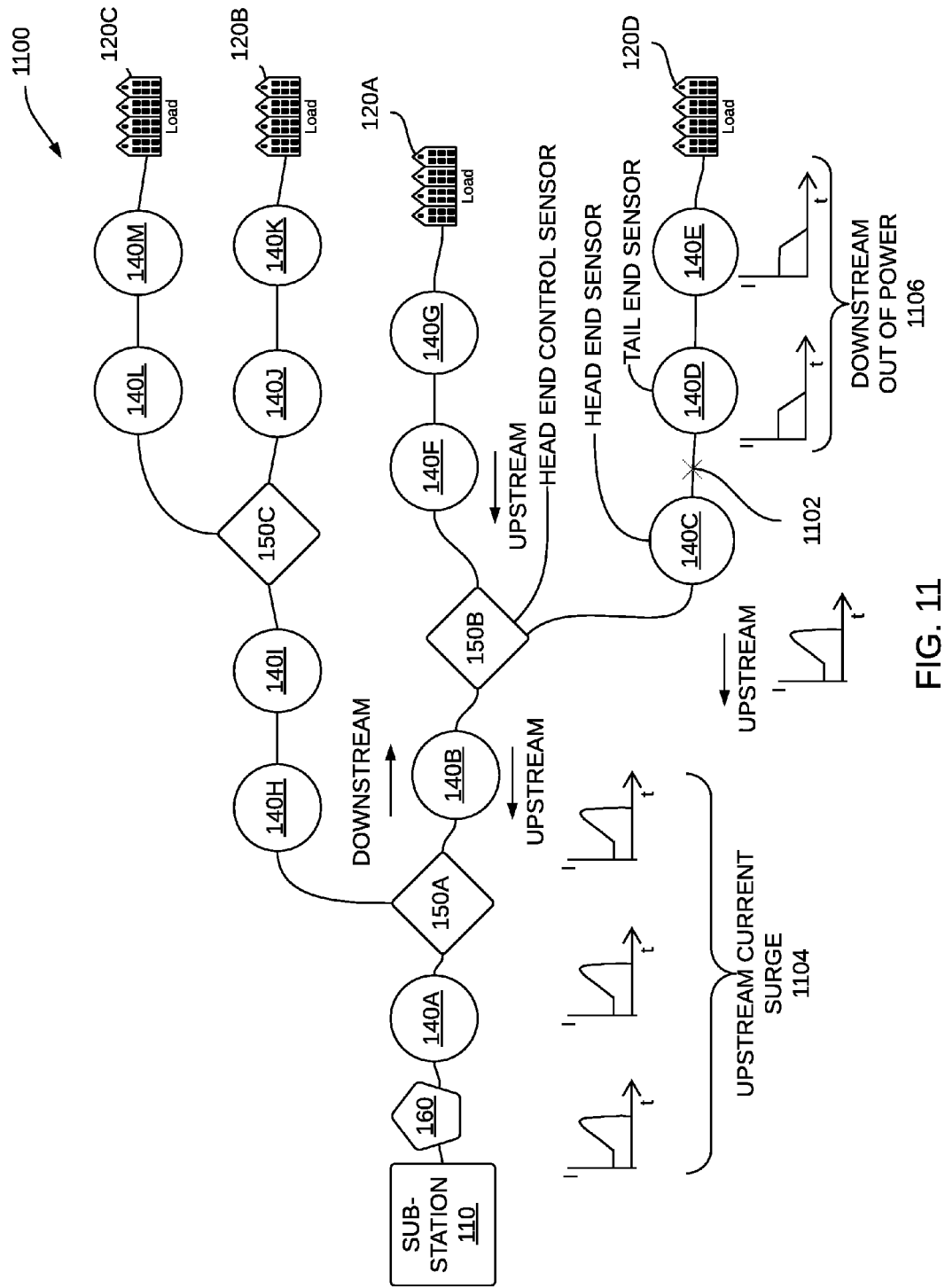
FIG. 11 illustrates different current signatures upstream and downstream of a fault in the electrical power grid shown in FIG. 1.

FIG. 11 shows an example of a fault scenario, when there is a fault condition, in the power grid 100. If a fault 1102 occurs, for example between sensors 140C and 140D, all upstream sensors 140A.150B,140B,150B,140C to the substation 110 will have similar upstream current pattern 1104 such as current surge before the power goes down completely. Downstream sensors 140D,140E on the load side will experience a different downstream current pattern 1106 that is, and in general, will go down without current surge.

Let's define monitor device 140D as a fault tail end device of the fault 1102, which is the first downstream device from the fault 1102, monitor device 140C as the head end device 140C of the fault 1102, which is the first upstream sensor device from the fault 1102 and control device 150B as the head end control device, which is the first control device upstream from the fault 1102. When the fault 1102 occurs, each downstream sensor 140D,140E will send a message to the next adjacent device downstream on the contention access timeslot forcing it to go into a sleep mode as soon as the downstream sensors 140D,140E detect the fault 1102. The fault tail end device 140D does not receive this messages will transmit its full information about the current during the fault in the upstream direction in the contention access time slots 712. The upstream monitor device 140C will wait for the information from the downstream monitor device 140D, and it relays the information of sensor 140D along with its own information about the fault current on another contention access slots 712. The information of both monitor devices 140C and 140D will travel upstream to the collector device 160. Since the electrical attributes of the wire 130D for all upstream sensors 140A, 150B, 140B, 150B, 140C is similar, no upstream sensor other than monitor device 140C will transmit information about the current in order to minimize energy and traffic. Control devices 150A and 150B will detect the fault 1102 almost instantly and will react when they receive the information from the fault head end monitor device 140C. Control device 150B determines that it is the fault head end monitor device 140C when it receives the information from the fault tail end device 140D and fault head end monitor device 140C and examines a frame header (not shown). It will then relay data received from monitor devices 140C and 140D on the contention access timeslot to the upstream sensors 140A, 150B, 140B, 150B and will set a flag to indicate for the upstream control device 150B that it has forced an associated automatic switch 324 to open so that the upstream control devices 140A, 150B, 140B, 150B can force their associated switches 324 to close for restoring power in that section of the grid 100. After collector device 160 receives all the information from the sensor devices 140A-140M and control devices 150A-150C, it will send it to a server (not shown) for further analysis.

Figure 12:
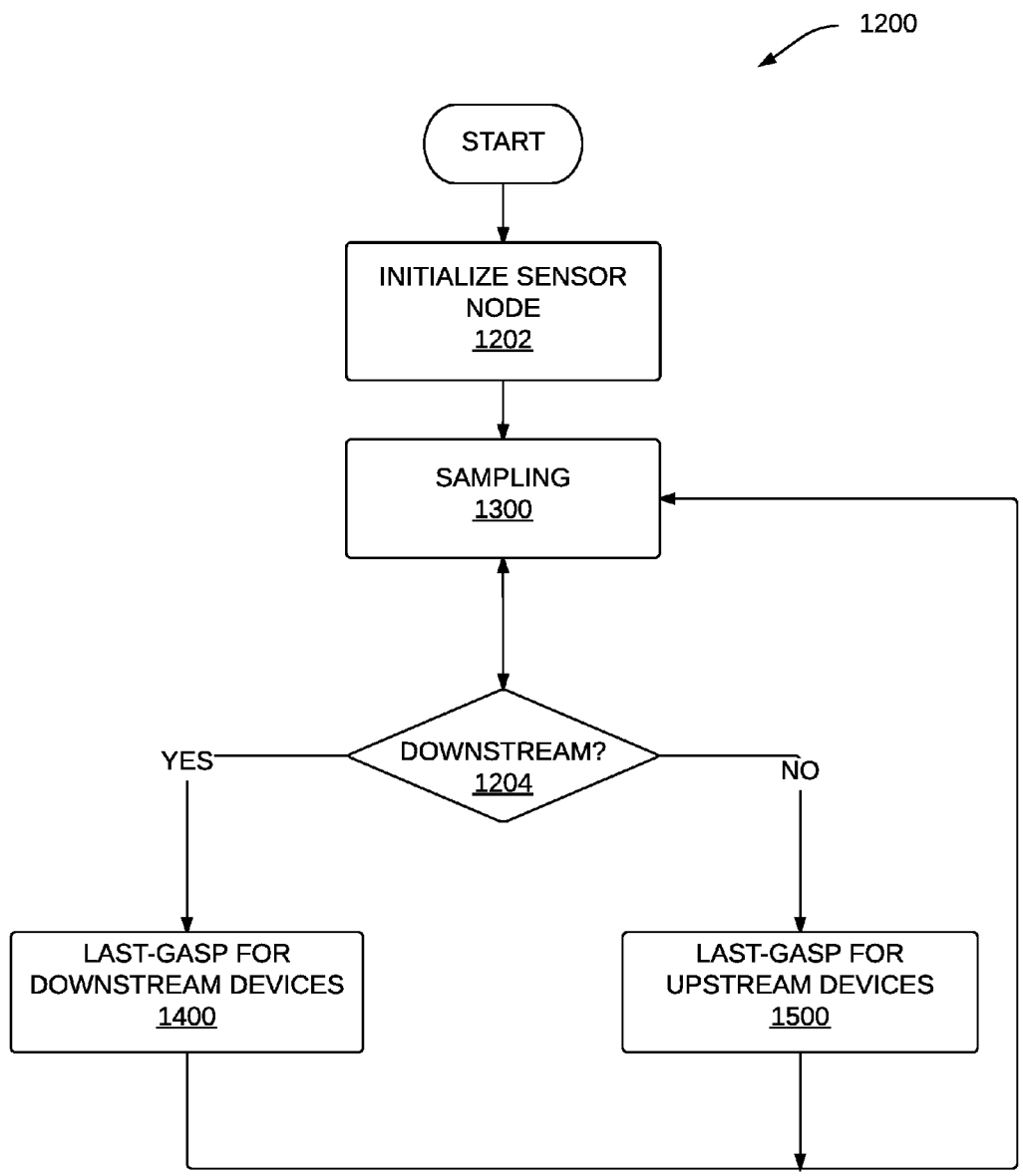
FIG. 12 is a flowchart of a method of reporting the fault shown in FIG. 11.

Referring now to FIG. 12 there is shown a flow chart of the sensor reporting method 1200 performed by microcontroller 308 in each sensor device 40A-140M,150A-150C in a normal mode of operation.

In step 1202, the collector device 160 initializes every monitor device 140A-140M and control device 150A-150C when it first joins the network 200. This initialization process 1202 includes loading each sensor device 140A-140M, 150A-150C with a map of adjacent neighboring devices and information on when the device should be transmitting and receiving its information in accordance with the timeslots 712, 708 in FIG. 9. In step 1300, each sensor device 140A-140M, 150A-150C proceeds to monitor and detect faults as described further herein below with reference to the flowchart of FIG. 13.

Figure 14:
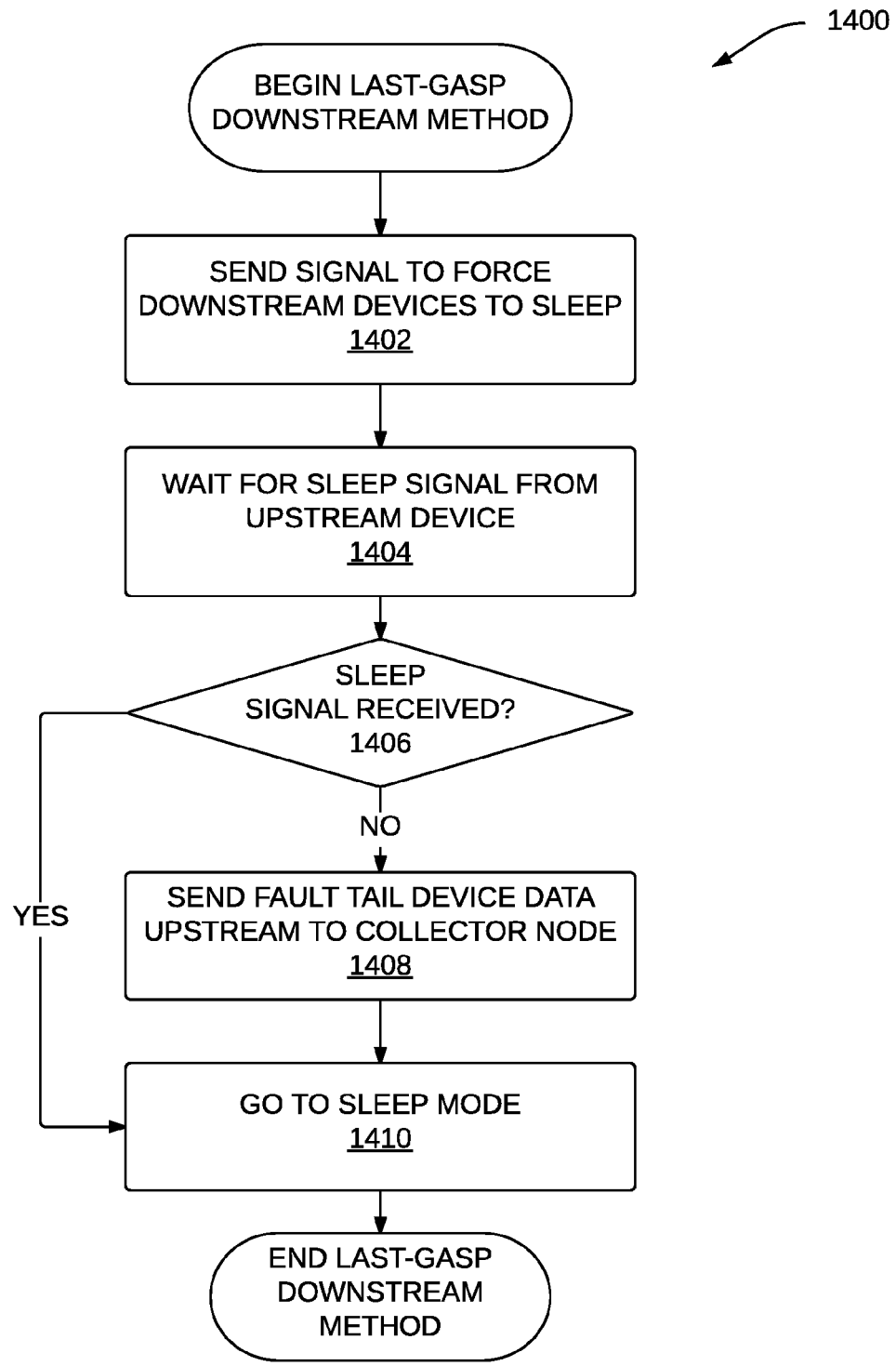
FIG. 14 is a flowchart of a downstream last-gasp step shown in FIG. 12.

In step 1204 when a fault is detected by one of the sensor devices 140A-140M, 150A-150C the sensor device determines if the fault is upstream or downstream from the measured data as described herein above with reference to FIG. 11. Provided the sensor device determines that the fault is downstream from the device a last-gasp method 1400, described herein below with reference to the flowchart of FIG. 14, is executed. Otherwise the fault is upstream from the device and a last-gasp upstream method 1500, described herein below with reference to the flowchart of FIGS. 15A and B, is executed.

Figure 13:
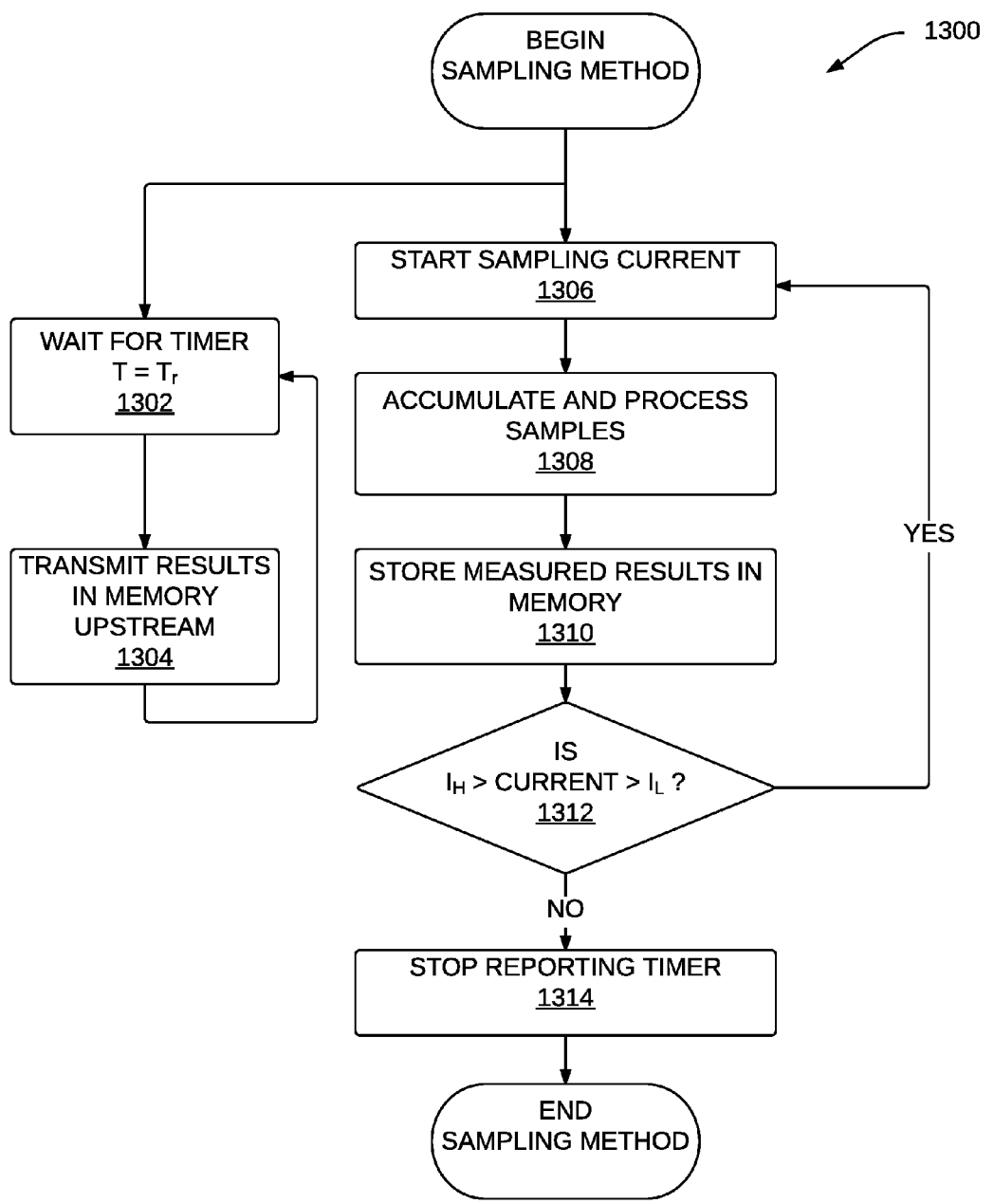
FIG. 13 is a flowchart of a sampling step shown in FIG. 12.

Referring now to FIG. 13, there is shown a flowchart of the sampling method shown in FIG. 12. Each sensor device 140A-140M, 150A-150C will start sampling 1306 the current then processing 1308 and storing 1310 the results in memory. In every cycle each sensor device 140A-140M, 150A-150C compares 1312 the current measurement against predetermined $I_L$ and $I_H$ thresholds. Provided the current measurement does not exceed these threshold values, it will go back to step 1306 and repeat the same process for time T+t1, and so on. In a concurrent parallel thread 1302 a reporting timer continuously checks if it is the devices turn to transmit 1304 the information upstream. Provided the current exceeded the predetermined threshold values, then it will stop 1314 the reporting timer and it will enter the last gasp routine depending whether the device is upstream from the fault or downstream. If the current surges to a higher value then goes down to zero as illustrated in 1104 the sensor is upstream towards the substation. If the current value goes down without surging then the sensor is in the downstream direction toward the load as illustrated in 1106.

Referring now to FIG. 14, there is shown a flowchart of the last-gasp downstream method shown in FIG. 12. Once a fault is detected, each downstream device transmits 1402 a fault detected message including a sleep command to the adjacent downstream sensor device to force it into sleep mode,1404. Provided the device didn't receive the sleep command after certain period of time 1406, the sensor will be at the tail end of the fault. This device will transmit 1408 fault tail end device data upstream to the collector device 160.

Figure 15A:
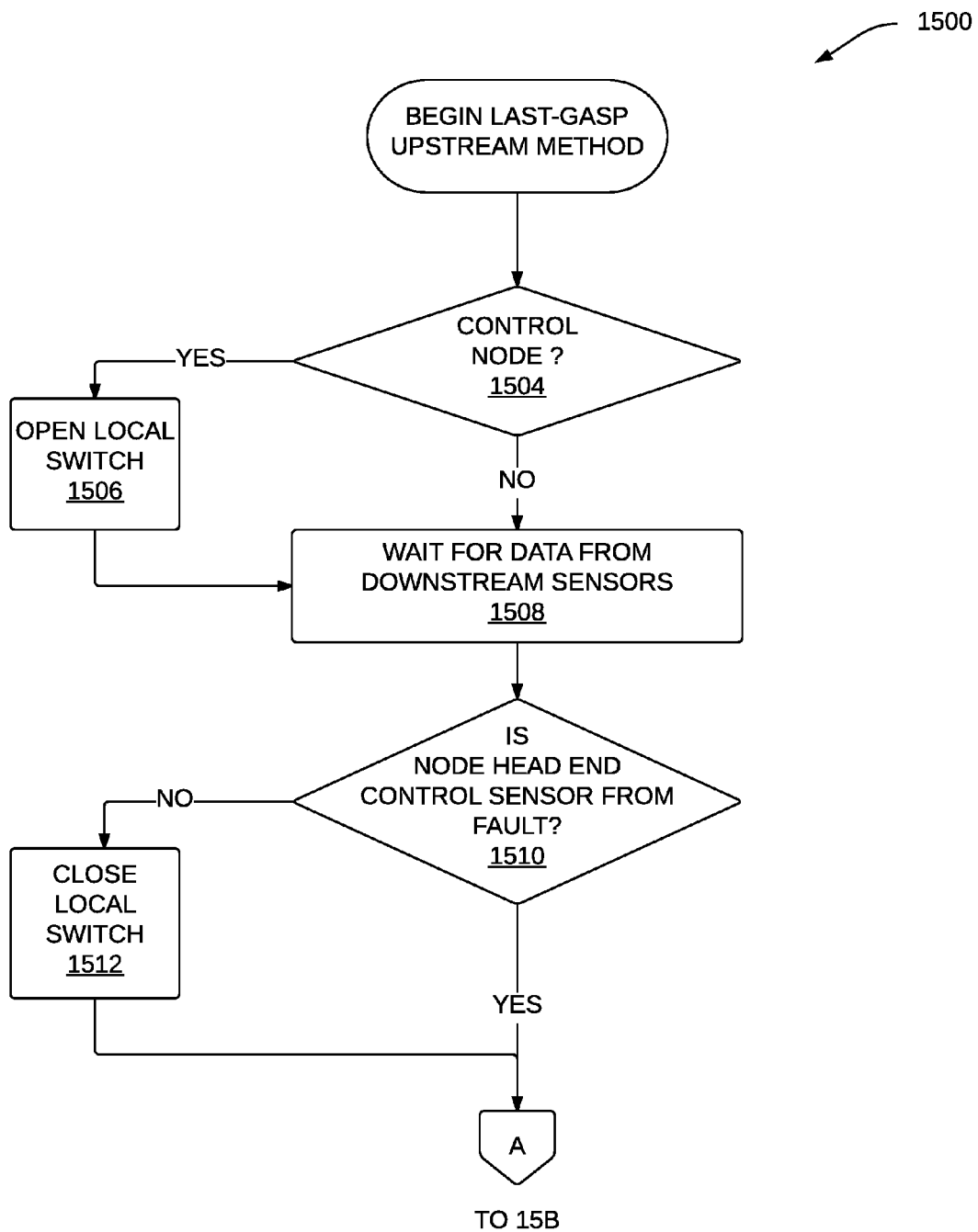
FIGS. 15A and B is a flowchart of an upstream last-gasp step shown in FIG. 14.
Figure 15B:
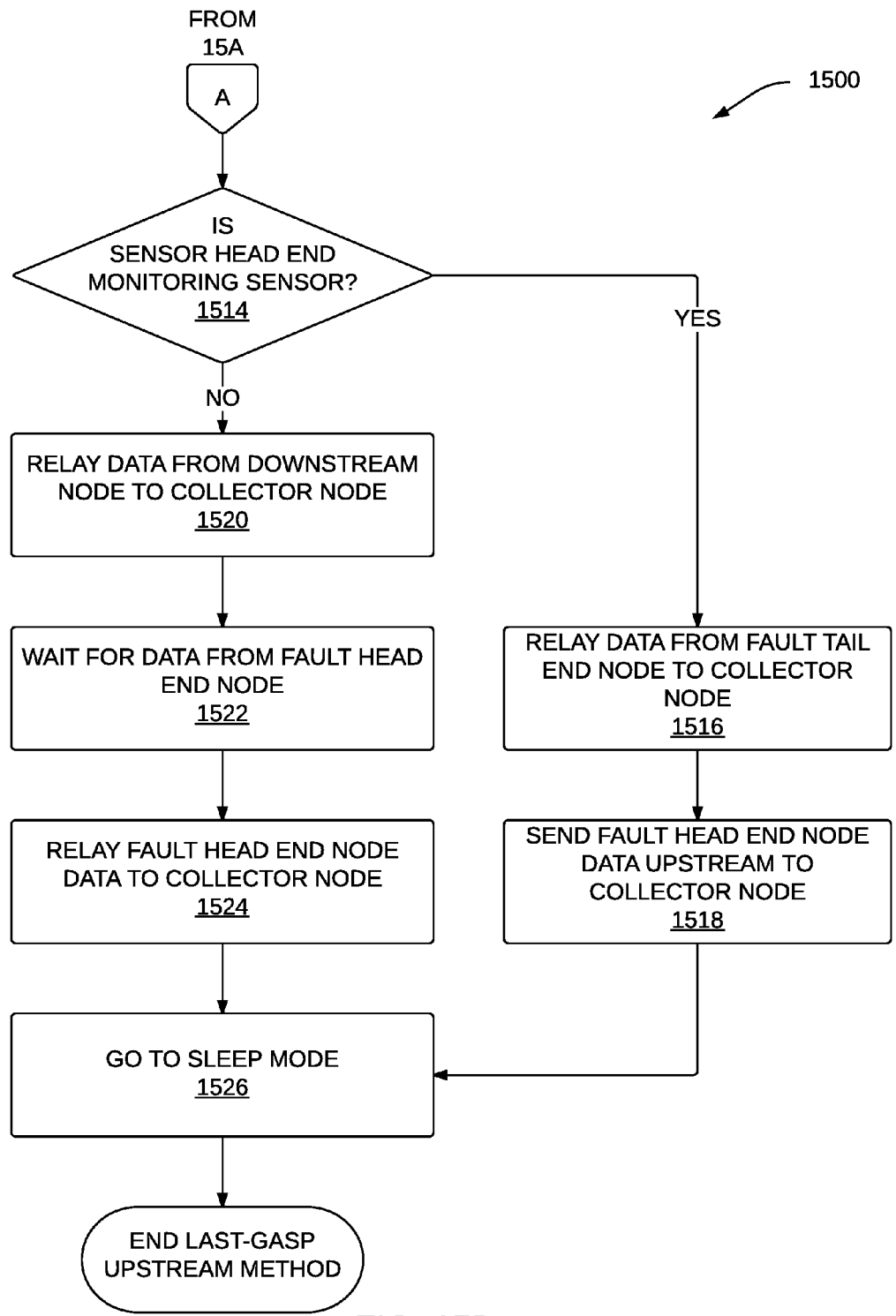

Referring now to FIGS. 15A and B, there is shown a flowchart of the last-gasp upstream method 1500 shown in FIG. 12. All of the control devices 150A-150C in the upstream direction along the path of the fault 1102 will force their automatic switches 324 to open 1504,1506. The fault tail end device 140D and head end monitor device 140C are the only sensors that will send a fault detected message to the adjacent upstream sensor device to the collector device 160. All of other sensor devices will relay this data. In step 1508, all upstream sensor devices 140A,150A,140B,150B, 140C will wait for the information coming from the downstream devices 140D,140E. Once received, the header is examined 1510 to determine if it is the head end control device 150B. Provided the device is not a head end device 140C, it will close 1512 the switch 324 associated with it.

In step 1514, provided the sensor is the head end control device 150B, it will send its own information about the electrical attributes of the fault current 1518 in the upstream direction toward the collector device 160 along with the information from the tail end device 1516 before it goes to sleep in step 1526. This information will be relayed from one sensor to the other until it reaches the collector device 160. Provided the sensor device is in the upstream of the fault 1102 and not a head end control sensor, it will wait 1522 for the data coming from the downstream sensors 140D,140E before it relays 1524 it to the collector device through the upstream sensor device 140A,150A,140B,150B,140C, before it goes to sleep 1525.

Thus, an improved method and system for monitoring an electric power grid have been provided. Furthermore, an improved method and system for reporting faults and control in an electrical power grid have also been provided.

Although the embodiment of the invention has been described in detail, it is understood by someone skilled in the art that variations and modifications to the embodiment may be made.

The invention claimed is:

1. A method for monitoring an in an electrical power grid, comprising:
   in a branch of the electrical power grid:
   detecting a fault by one of a plurality of sensors on the branch of the power grid;
   determining if the one of the plurality of sensors is upstream from the fault;
   provided the one of the plurality of sensors is at a tail end from the fault,
   sending a fault detected message to an adjacent upstream sensor; and
   otherwise,
   sending a sleep command to an adjacent downstream sensor from the one of the plurality of sensors for suppressing data transmission of the adjacent downstream sensor.

2. The method of claim 1 wherein the sending the fault detected message to the adjacent upstream sensor further comprises:
   provided the one of the plurality of sensors is a fault head end sensor,
   relaying data from a fault tail end sensor to a collector device, and sending a fault head end sensor data upstream to the collector device;
otherwise,
relaying data from the adjacent downstream sensor to the collector device;
waiting for data from a fault head end device; and
relaying fault head end device data to the collector device.

3. The method of claim 1 wherein the sending the fault detected message to the adjacent upstream sensor further comprises:
provided the one of the plurality of sensors is a control sensor having a switch,
opening the switch; and
otherwise,
waiting for data from the adjacent downstream sensor.

4. The method of claim 1 wherein the sending the fault detected message to the adjacent upstream sensor further comprises:
provided the one of the plurality of sensors is not a head end control sensor from the fault,
closing a switch, putting the one of the plurality of sensors in a sleep mode.

5. The method of claim 1 wherein the sending the fault detected message to the adjacent upstream sensor comprises sending the fault detected message to the adjacent upstream sensor on a wireless network comprising a plurality of contention free time slots wherein a number of the contention free time slots is equal to or greater than a quantity of sensors in the plurality of sensors.

6. The method of claim 5 wherein subsets of the contention free time slots are allocated into frames.

7. The method of claim 1 wherein the sending the sleep command comprises sending the sleep command to the adjacent downstream sensor from the one of the plurality of sensors on a wireless network comprising a plurality of contention free time slots wherein a number of the contention free time slots is equal to or greater than a quantity of sensors in the plurality of sensors.

8. The method of claim 7 wherein subsets of the contention free time slots are allocated into frames.

9. The method of claim 1 further comprising:
initializing each of the plurality of sensors comprising:
loading each of the plurality of sensors with a map of adjacent sensors; and
loading each of the plurality of sensors with information for designating a respective assigned time slot for transmitting and receiving data.

10. The method of claim 9 further comprising:
adding another sensor to the plurality of sensors comprising:
loading the another sensor with a map of adjacent sensors; and
loading the another sensor with information for designating an assigned time slot for the another sensor for transmitting and receiving data.

11. A system for monitoring a fault in an electrical power grid, comprising:
a plurality of sensors on the electrical power grid, each sensor including a processor and a memory having computer readable instructions stored thereon, causing the processor to:
detect a fault by one of the plurality of sensors on a branch of the power grid;
determine if the one of the plurality of sensors is upstream from the fault;
provided the one of the plurality of sensors is at a tail end from the fault,
send a fault detected message to an adjacent upstream sensor; and
otherwise,
send a sleep command to an adjacent downstream sensor from the one of the plurality of sensors for suppressing data transmission of the adjacent down-stream sensor.

12. The system of claim 11 wherein the computer readable instructions causing the processor to send the fault detected message to the adjacent upstream sensor comprise computer readable instructions that cause the processor to:
provided the one of the plurality of sensors is a head end device,
relay data from a fault tail end device to a collector device;
send data from a fault head end device upstream to the collector device; and
put the one of the plurality of sensors in a sleep mode; and otherwise,
relay data from the adjacent downstream sensor to the collector device
wait for the data from the fault head end device; and
relay the data from the fault head end device to the collector device.

13. The system of claim 11 wherein the computer readable instructions causing the processor to send the fault detected message further cause the processor to:
provided the one of the plurality of sensors is a control device having a switch,
open the switch; and
otherwise,
wait for data from the adjacent downstream sensor.

14. The system of claim 11 wherein the computer readable instructions causing the processor to send the fault detected message further cause the processor to:
provided the one of the plurality of sensors is not a head end control sensor from the fault, close a switch, putting the one of the plurality of sensors in a sleep mode.

15. The system of claim 11 wherein the computer readable instructions causing the processor to send the fault detected message comprise instructions to send the fault detected message to the adjacent upstream sensor on a wireless network comprising a plurality of contention free time slots wherein a number of the contention free time slots is equal to or greater than a quantity of sensors in the plurality of sensors.

16. The system of claim 15 wherein subsets of the contention free time slots are allocated into frames.

17. The system of claim 11 wherein the computer readable instructions causing the processor to send the sleep command comprise instructions to send the sleep command to the adjacent downstream sensor from the one of the plurality of sensors on a wireless network comprising a plurality of contention free time slots wherein a number of the contention free time slots is equal to or greater than a quantity of sensors in the plurality of sensors.

18. The system of claim 17 wherein subsets of the contention free time slots are allocated into frames.

19. The system of claim 11 wherein the computer readable instructions further cause the processor to:
initialize each of the plurality of sensors comprising:
loading each of the plurality of sensors with a map of adjacent sensors; and loading each of the plurality of sensors with information for designating a respective assigned time slot for transmitting and receiving data.

20. The system of claim 19 wherein the computer readable instructions further cause the processor to:
add another sensor to the plurality of sensors comprising:
loading the another sensor with a map of adjacent sensors; and
loading the another sensor with information for designating an assigned time slot for the another sensor for transmitting and receiving data.

* * * * *